(12) United States Patent
Kang et al.

(10) Patent No.: US 7,534,545 B2
(45) Date of Patent: *May 19, 2009

(54) METHOD OF MAKING AN ORGANIC LIGHT EMITTING DISPLAY DEVICE

(75) Inventors: Tae Min Kang, Yongin-si (KR); Jin Soo Kim, Yongin-si (KR); Mu Hyun Kim, Yongin-si (KR); Sun Hoe Kim, Jeongeup-si (KR); Noh Min Kwak, Yongin-si (KR); Sang Bong Lee, Yongin-si (KR); Seong Taek Lee, Yongin-si (KR); Seung Hyun Lee, Yongin-si (KR); Sok Won Noh, Seoul (KR); Jin Wook Seong, Seoul (KR); Myung Won Song, Yongin-si (KR); Yeun Joo Sung, Yongin-si (KR); Byeong Wook Yoo, Yongin-si (KR)

(73) Assignee: Samsung SDI Co., Ltd. (KR)

( * ) Notice: Subject to any disclaimer, the term of this patent is extended or adjusted under 35 U.S.C. 154(b) by 241 days.

This patent is subject to a terminal disclaimer.

(21) Appl. No.: 11/511,021

(22) Filed: Aug. 28, 2006

(65) Prior Publication Data

US 2007/0048658 A1 Mar. 1, 2007

(30) Foreign Application Priority Data

| Aug. 30, 2005 | (KR) | 10-2005-0080347 |
| Aug. 30, 2005 | (KR) | 10-2005-0080348 |
| Aug. 30, 2005 | (KR) | 10-2005-0080349 |
| Nov. 16, 2005 | (KR) | 10-2005-0109814 |
| Nov. 16, 2005 | (KR) | 10-2005-0109815 |
| Nov. 16, 2005 | (KR) | 10-2005-0109816 |
| Nov. 16, 2005 | (KR) | 10-2005-0109819 |
| Nov. 16, 2005 | (KR) | 10-2005-0109820 |
| Nov. 16, 2005 | (KR) | 10-2005-0109821 |
| Nov. 16, 2005 | (KR) | 10-2005-0109822 |

(51) Int. Cl.
G03C 8/00 (2006.01)
(52) U.S. Cl. .................... 430/201; 430/200
(58) Field of Classification Search ............... 430/200, 430/201
See application file for complete search history.

(56) References Cited

U.S. PATENT DOCUMENTS

| 4,377,339 | A | 3/1983 | Coppock |
| 6,689,538 | B2 * | 2/2004 | Hoffend et al. ......... 430/273.1 |
| 7,217,334 | B2 * | 5/2007 | Toyoda .................. 156/230 |
| 7,233,101 | B2 * | 6/2007 | Jin ........................ 313/309 |
| 2007/0103920 | A1 * | 5/2007 | Noh et al. ............... 362/458 |

FOREIGN PATENT DOCUMENTS

CN 1436025 8/2003

(Continued)

*Primary Examiner*—Thorl Chea
(74) *Attorney, Agent, or Firm*—Knobbe Martens Olson & Bear LLP

(57) ABSTRACT

A laser induced thermal imaging (LITI) apparatus and a method of making an electronic device using the same are disclosed. The LITI apparatus includes a chamber, a substrate support, a contact frame, and a laser source or oscillator. The LITI apparatus transfers a transferable layer from a film donor device onto a surface of an intermediate electronic device. The LITI apparatus uses a magnetic force to provide a close contact between the transferable layer and the surface of the intermediate device. The magnetic force is generated by magnetic materials formed in two components of the LITI apparatus that are spaced apart interposing transferable layer and the surface of the intermediate device. Magnets or magnetic materials are formed in the two following components of the LITI apparatus: 1) the intermediate device and the film donor device; 2) the intermediate device and the contact frame; 3) the substrate support and the film donor device; or 4) the substrate support and the contact frame.

20 Claims, 18 Drawing Sheets

FOREIGN PATENT DOCUMENTS

| | | |
|---|---|---|
| JP | 09-174271 | 7/1997 |
| JP | 2002-057433 | 2/2002 |
| JP | 2002-144069 | 5/2002 |
| JP | 2004-296224 | 10/2004 |
| JP | 2004-355949 | 12/2004 |
| JP | 2005-152966 | 6/2005 |
| JP | 2005-249937 | 9/2005 |
| KR | 10-2005-0063534 A | 6/2005 |
| KR | 10-2006-0000745 A | 1/2006 |

* cited by examiner

METHOD OF MAKING AN ORGANIC LIGHT EMITTING DISPLAY DEVICE

CROSS-REFERENCE TO RELATED APPLICATIONS

This application claims the benefit of Korean Patent Application Nos. 10-2005-0080347, 10-2005-0080348, and 10-2005-0080349, filed on Aug. 30, 2005, and Korean Patent Application Nos. 10-2005-0109814, 10-2005-0109815, 10-2005-0109816, 10-2005-0109819, 10-2005-0109820, 10-2005-109821, and 10-2005-0109822, filed on Nov. 16, 2005, in the Korean Intellectual Property Office, the disclosures of which are incorporated herein by reference.

This application is related to and incorporates herein by reference the entire contents of the following concurrently filed applications: ORGANIC LIGHT EMITTING DISPLAY DEVICE (filed Aug. 28, 2006, application Ser. No. 11/511,111, published as Application Publication No. 2007/0063205); LASER INDUCED THERMAL IMAGING APPARATUS WITH CONTACT FRAME (filed Aug. 28, 2006, application Ser. No. 11/511,205, published as Application Publication No. 2007/0045540); FILM DONOR DEVICE FOR LASER INDUCED THERMAL IMAGING (filed Aug. 28, 2006, application Ser. No. 11/511,153, published as Application Publication No. 2007/0046762); and LASER INDUCED THERMAL IMAGING APPARATUS (filed Aug. 28, 2006, application Ser. No. 11/510,997, published as Application Publication No. 2007/0046072).

BACKGROUND OF THE INVENTION

1. Field of the Invention

The present invention relates to production of electronic devices, and more particularly, forming organic material layers in electronic devices using a laser induced thermal imaging (LITI) technology.

2. Description of the Related Technology

Certain electronic devices include organic layers. For example, an organic light emitting device (OLED) includes various organic layers. Various methods have been used to form such organic layers. For example, such methods include a deposition method, an inkjet method, and a laser-induced thermal imaging (LITI) method.

In the LITI method, a film donor device is used to provide a transferable layer. The donor device is placed on a partially fabricated electronic device (intermediate device) such that the transferable layer contacts a surface (receiving surface) of the intermediate device on which the transferable layer is to be transferred. Then, a laser beam is applied onto selected areas of the donor device, which creates heat in the donor device in the selected area. The heat causes delamination of desired portions of the transferable layer. The delaminated portions of the transferable layer remain on the surface of the intermediate device when the donor device is removed.

A typical LITI apparatus uses suction to make and keep the transferable layer contact the surface of the intermediate device during this processing. FIG. 1 is a cross-sectional view of an LITI apparatus 100. The LITI apparatus 100 includes a chamber 110, a substrate support 120 and a laser source or oscillator 130. The substrate support 120 includes an intermediate device receiving groove 121 to receive an intermediate electronic device 140 therein and a donor device receiving groove 123 to receive a film donor device 150 therein.

To transfer organic material portions to the intermediate device with high precision and with fewer defects, a close contact between the transferable layer and the receiving surface is needed. The LITI apparatus 100 includes a suction mechanism to form such a close contact. The suction mechanism includes pipes 161 and 163 and a vacuum pump P. Suction through the pipes 161 brings and keeps the intermediate device (not shown) placed in the groove 121 down. Suction through the pipes 163 brings and keeps the donor device (not shown) placed in the groove 123 down and in contact with the intermediate device. To conduct these suctions, air or other gaseous medium is required within the chamber.

However, processes performed prior to or subsequent to the LITI process are typically carried out in a vacuum atmosphere. Thus, the LITI process using the suction described above needs to break the vacuum between the preceding and subsequent processes.

The discussion in this section is to provide background information of the related technology and does not constitute an admission of prior art.

SUMMARY OF CERTAIN INVENTIVE ASPECTS

One aspect of the invention provides a method of making an electronic device using laser-induced thermal imaging, the method comprising: providing a receiving apparatus comprising an intermediate product and a supporting device, the intermediate product comprising a receiving surface, the supporting device being configured to support the intermediate product, the receiving apparatus comprising a first magnetic layer; providing a film donor apparatus comprising a second magnetic layer and a transferable film layer, wherein each of the first and second magnetic layers comprises a magnet or a magnetically attractable material such a magnetically induced attractive force is created between the first and second magnetic layers when arranged closely; arranging the receiving apparatus and the film donor apparatus such that the transferable film layer faces the receiving surface and that the transferable film layer and the receiving surface are interposed between the first and second magnetic layers; and approaching the film donor apparatus toward the receiving apparatus so as to create an attractive force between the first and second magnetic layers sufficient to make the transferable film layer contacts the receiving surface.

The method may further comprise transferring at least part of the transferable film layer onto the receiving surface. The method may further comprise separating the film donor apparatus from the receiving apparatus, and the at least part of the transferable film layer transferred onto the receiving surface may remain on the receiving surface.

The film donor apparatus may further comprise a substrate and a light-to-heat conversation layer interposed between the transferable film layer and the substrate, and the method may further comprise applying light to the light-to-heat conversion layer so as to generate heat therein and transfer the heat to the transferable film layer. The attractive. force may maintain the transferable film layer to contact the receiving surface substantially free of bubbles therebetween during applying light to the light-to-heat conversion layer. The magnet may comprise an electromagnet, and the method may further comprise applying an electrical power to the electromagnet during applying the light.

The electronic device may comprise an organic light emitting display. The transferable film layer may comprise an organic material to form a layer of the organic light emitting display selected from the group consisting of a light emitting layer, a hole injection layer, a hole transportation layer, an electron injection layer and an electron transportation layer. The method may be performed in a substantially vacuum atmosphere without breaking the substantially vacuum atmosphere during the steps of arranging and approaching.

The magnet may comprise at least one selected from the group consisting of a permanent magnet and an electromagnet. The magnet or magnetically attractable material may comprise one or more forms selected from the group consisting of plates, chips, rods, and particles.

The magnetically attractable material may comprise one or more materials selected from the group consisting of Fe, Ni, Cr, $Fe_2O_3$, $Fe_3O_4$, $CoFe_2O_4$, and alloys of two or more of the foregoing. The first and second magnetic layers may comprise the magnet or the magnetically attractable material in an amount sufficient to generate a magnetic field from about 5 mG (gauss) to about 50 mG (gauss). The intermediate product may comprise the first magnetic layer. The supporting device may comprise the first magnetic layer.

The film donor apparatus may comprise a single integrated device comprising the transferable film layer and the second magnetic layer. The film donor apparatus may comprise a single integrated film donor device comprising a substrate and the transferable film layer, and the film donor apparatus further may comprise a contact frame configured to provide a weight onto the film donor device such that the film donor device is pressed against the receiving surface of the intermediate product. The contact frame may comprise the second magnetic layer. One of the first and second magnetic layers may comprise the magnet, and the other of the first and second magnetic layers may comprise the magnetically attractable material. The magnet or the magnetically attractable material may be distributed substantially throughout the first and second magnetic layers.

BRIEF DESCRIPTION OF THE DRAWINGS

Aspects and advantages of the invention will become apparent and more readily appreciated from the following description, taken in conjunction with the accompanying drawings.

DETAILED DESCRIPTION OF CERTAIN INVENTIVE EMBODIMENTS

Figure 1:
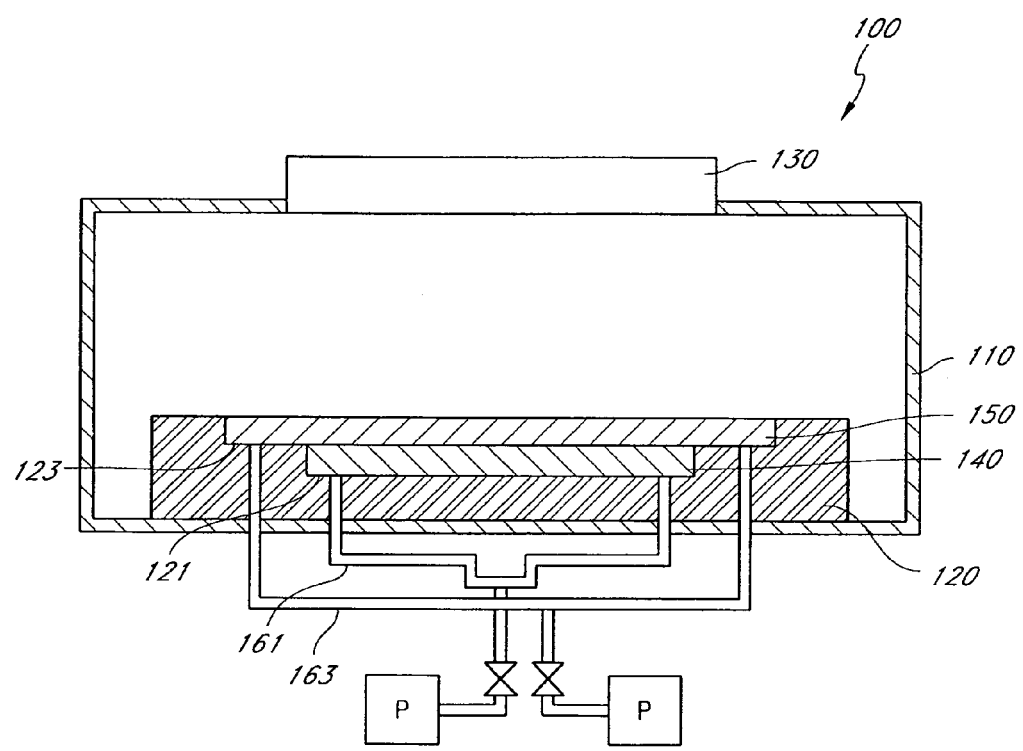
FIG. 1 illustrates a schematic cross-sectional view of a laser-induced thermal imaging apparatus.

Various embodiments of the invention will be described in detail with reference to the accompanying drawings. In the drawings, like reference numerals indicate identical or functionally similar parts or elements.

Laser-Induced Thermal Imaging Apparatus

In embodiment, a LITI apparatus uses a magnetic force to provide a close contact between a film donor device and an intermediate device. Unlike suctioning in the LITI apparatus of FIG. 1, the magnetic force does not require air or fluid within the chamber. In embodiments, contacting the film donor device and intermediate device using the magnetic force can be performed either in vacuum or non-vacuum.

Figure 2:
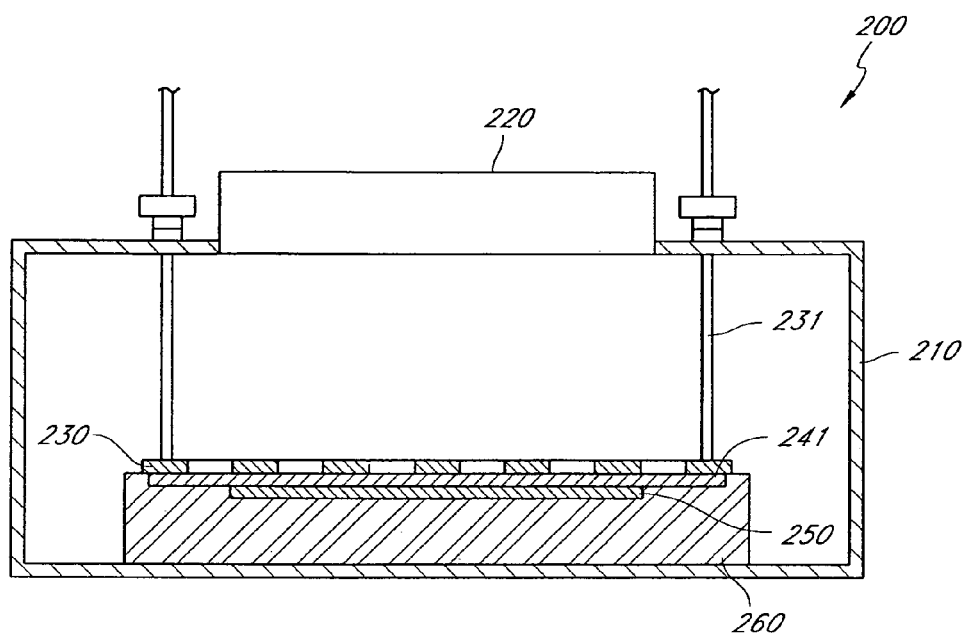
FIG. 2 illustrates a schematic cross-sectional view of a laser-induced thermal imaging apparatus according to one embodiment of the invention.

FIG. 2 illustrates a LITI apparatus 200 in accordance with one embodiment. The illustrated LITI apparatus includes a chamber 210, a substrate support 260, a contact frame 230, and a laser source or oscillator 220. The chamber 210 provides a space for processing an intermediate (or partially fabricated) electronic device 250 with a film donor device 241. The substrate support 260 is configured to support the intermediate device 250 and the film donor device 241. The contact frame 230 is movably connected to the chamber 210 for providing a weight downward over the film donor device 241. In certain embodiments, the contact frame 230 may be omitted. The film donor device 241 includes a transferable layer (not shown). The transferable layer will be transferred onto the intermediate device by a laser. The laser oscillator 220 is positioned over the contact frame 230. The laser oscillator 220 is configured to irradiate a laser onto the film donor device 241 through the contact frame 230.

In one embodiment, the LITI apparatus 200 operates as follows. First, the intermediate device 250 is introduced into the chamber 210 and is placed onto the substrate support 260. Then, the film donor device 241 is placed over the intermediate device 250. The film donor device 241 comes at least partially in contact with the intermediate device 250. The film donor device 241 is pressed against the intermediate device 250, using a magnetic force. During this step, the transferable layer is closely contacted with the intermediate device. The laser oscillator 220 is activated to irradiate a laser onto the film donor device 241. Then, the transferable layer is transferred from the film donor device 241 to the intermediate device 250.

Figure 3:
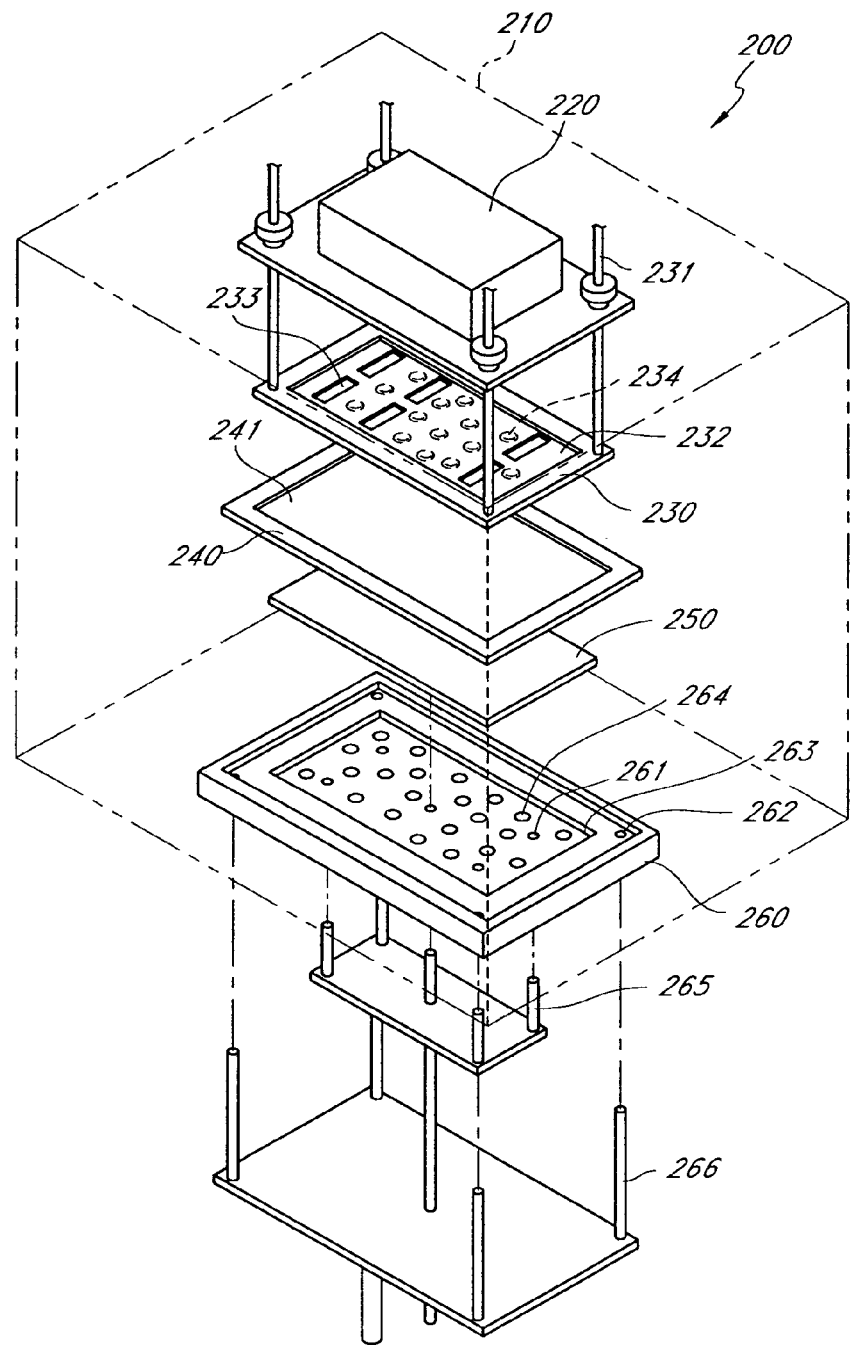
FIG. 3 illustrates a schematic exploded perspective view of a laser-induced thermal imaging apparatus according to one embodiment of the invention.

FIG. 3 illustrates a schematic exploded view of the LITI apparatus 200. The chamber 210 is shown in dotted lines. In the illustrated embodiment, the laser oscillator 220, the contact frame 230 and the substrate support 260 are vertically aligned with one another. During the LITI process, an intermediate device 250 is placed on the substrate support 260, and a film donor device 241 is placed over the intermediate device 250. In another embodiment, the foregoing components may have a different arrangement, for example, a reversed configuration. In some embodiments, the substrate support may be configured to hold the intermediate device from the top. Such a substrate support may be referred to as a substrate holder.

The chamber 210 provides a reaction space for the LITI process. The chamber may be any suitable enclosed space in which the LITI process can be carried out. The chamber 210 houses the contact frame 230 and the substrate support 260. The chamber also includes a door for introducing or removing the intermediate device 250 and the film donor device 241. In one embodiment, the chamber 210 may be configured to provide a vacuum atmosphere.

Figure 11:
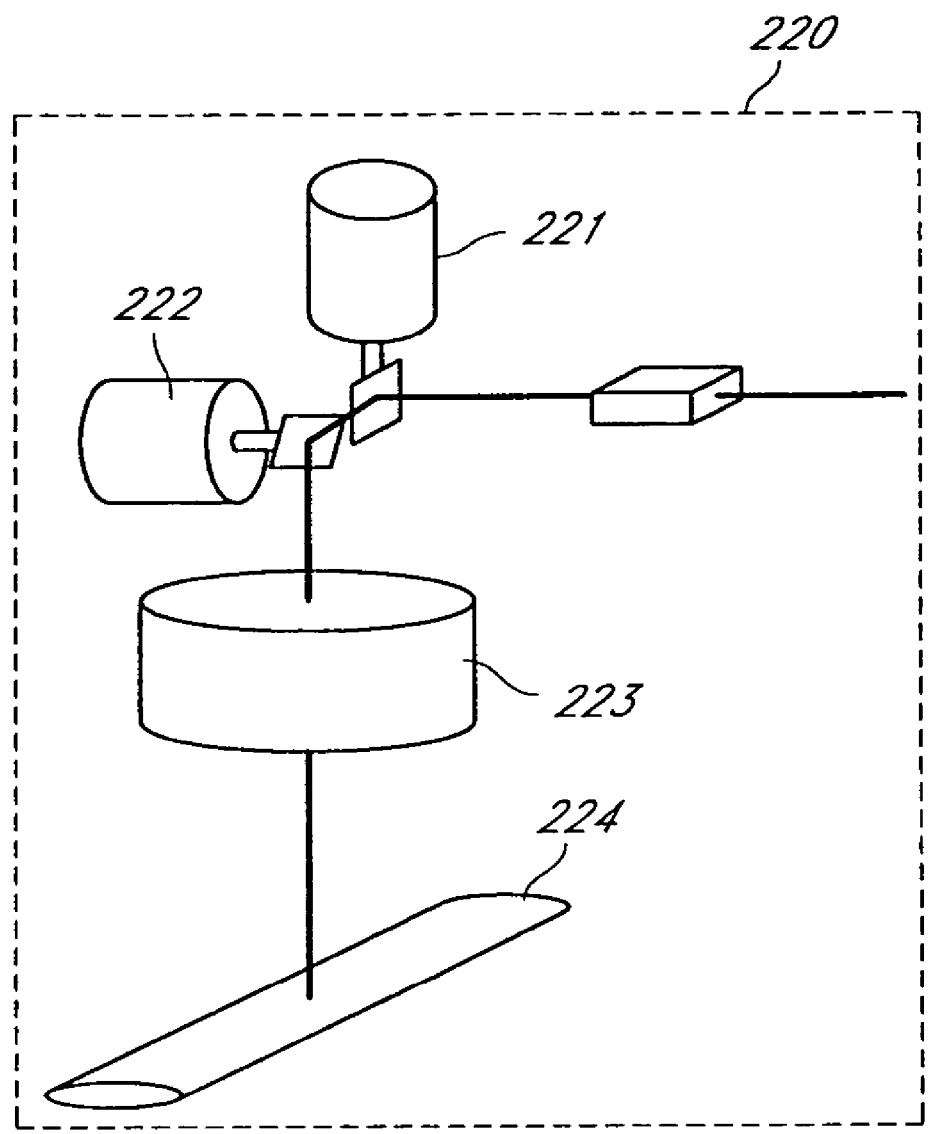
FIG. 11 illustrates a schematic perspective view of a laser oscillator according to one embodiment of the invention.

In the illustrated embodiment, the laser oscillator 220 is positioned at the top central portion of the chamber 210 over the contact frame 230 although not limited thereto. The laser oscillator 220 is configured to irradiate a laser beam onto the film donor device 241. FIG. 11 illustrates one embodiment of the laser oscillator 220. The illustrated laser oscillator 220 may be a CW ND:YAG laser (1604 nm). The laser oscillator 220 has two galvanometer scanners 221, 222. The laser oscillator 220 also has a scan lens 223 and a cylinder lens 224. A skilled artisan will appreciate that various types of laser oscillators can be adapted to provide a laser for the film donor device.

In the illustrated embodiment, the contact frame 230 is positioned over the substrate support 260 although not limited thereto. The contact frame 230 is movably connected via a transmission unit 231 to the top central portion of the chamber 210. The contract frame 230 has a contact plate 232 configured to provide a weight over the film donor device 241. The contact plate 232 is patterned to expose portions of the underlying film donor device 241 while blocking other portions. To expose the portions of the film donor device 241, the contact plate 232 includes a plurality of openings 233. The openings 233 allow the laser beam to be directed to the portions of the film donor device 241. This configuration allows to transfer portions of the transferable layer onto the intermediate device 250 as will be described later in detail. In certain embodiments, the LITI apparatus may have no contact frame.

In the illustrated embodiment, the substrate support 260 is positioned at the bottom of the reaction chamber 210 although not limited thereto. The illustrated substrate support 260 has a recess 263 to accommodate the intermediate device 250. The substrate support 260 also supports the film donor device 241. In addition, the substrate support 260 accommodates a substrate lifter 265 and a film donor device lifter 266 underneath. The substrate support 260 has through-holes 261 and 262 through which the substrate lifter 265 and the film donor device lifter 266 move in a vertical direction.

The intermediate device 250 is placed on the substrate support 260 during the LITI process. The term, "intermediate device" refers to any devices having a surface to form an organic material using the LITI process. Typically, such devices are partially fabricated electronic device. In one embodiment, the intermediate device 250 is a partially fabricated organic light emitting device. The intermediate device 250 includes a surface onto which the transferable layer is to be transferred.

The film donor device 241 is placed over the intermediate device 250 during the LITI process. In one embodiment, the film donor device 241 includes a base substrate, a light-to-heat conversion layer, and a transferable layer, which will be further described later. The illustrated film donor device 241 also includes a film donor device tray 240 surrounding the film donor device 241. The film donor device tray 240 serves as a frame for maintaining the shape of the film donor device 241. The transferable layer is arranged to face the surface of the inter layer during LITI processing.

The LITI apparatus 200 of FIG. 3 uses a magnetic force to provide a close contact between the film donor device 241 and the intermediate device 250. The magnetic force holds the devices 241 and 250 in close contact, substantially free of air gaps or bubbles from between the devices 241 and 250.

In one embodiment, the magnetic force may be generated by two or more magnetic materials spaced apart. In embodiments, magnetic materials are formed in two components of the LITI system that are spaced apart interposing transferable layer and the surface on which the transferable layer is to be transferred, i.e., one positioned over the transferable layer and the other positioned under the surface. Here, the term "components" refer to parts and devices used in the LITI process, which include the intermediate device 250, the film donor device 241, the contact frame 230 and the substrate support 260. In embodiments, magnets or magnetic materials are formed in the two following components of the LITI system, but not limited to: 1) the intermediate device 250 and the film donor device 241; 2) the intermediate device 250 and the contact frame 230; 3) the substrate support 260 and the film donor device 241; or 4) the substrate support 260 and the contact frame 230.

Optionally, the magnetic materials may be provided in one of the following combinations of components of the LITI system: 5) the substrate support 260, the intermediate device 250, and the contact frame 230; 6) the substrate support 260, the intermediate device 250, and the film donor device 241; 7) the substrate support 260, the film donor device 241, and the contact frame 230; or 8) the intermediate device 250, the film donor device 241, and the contact frame 230. In yet another embodiment, the magnetic material may be provided in 9) the substrate support 260, the intermediate device 250, the film donor device 241, and the contact frame 230. A skilled artisan will appreciate that the magnetic material may be provided in certain other components, depending on the design of a LITI apparatus.

The magnetic materials in the pair of components are configured to attract each other such that the film donor device 241 and the intermediate device 250 form a close contact between the transferable layer and the surface on which the layer is to be transferred. The term, "magnetic material," as used herein, refers to either a magnet or a magnetically attractive material. A "magnet" may generally refer to a permanent or electromagnet unless otherwise indicated. The term, "magnetically attractable material," as used herein, refers to a material which is not a magnet, but can be attracted by a magnet. In some embodiments, one of the two LITI components may include a magnet whereas the other may include a magnetically attractable material that is not a magnet. In other embodiments, both of the two LTIT components may include magnets. In certain embodiments, components including a magnet may also contain a magnetically attractable material. In all the embodiments, the components include the magnetic materials in an amount to generate a sufficient magnetic force to provide a close contact between the film donor device 241 and the intermediate device 250.

The magnetic force can be created in a vacuum atmosphere unlike suction. Thus, in some embodiments, the LITI process may be performed in vacuum using the magnetically induced contact between the film donor device 241 and the intermediate device 250 without breaking the vacuum. Further, in other embodiments, the magnetic force system may also be used together with the suction system to improve the LITI process. The positions and configurations of the magnet or magnetically attractable material in each component will be described below in detail.

Figure 4A:
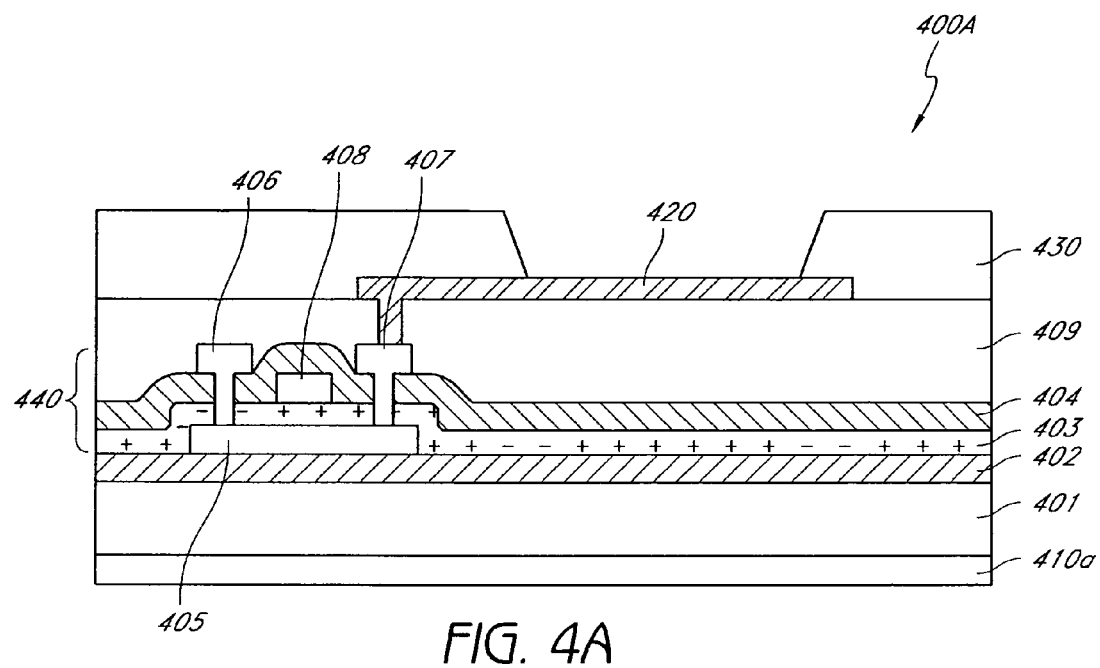
FIGS. 4A and 4B illustrate schematic cross-sectional views of partially fabricated electronic devices according to embodiments of the invention.
Figure 4B:
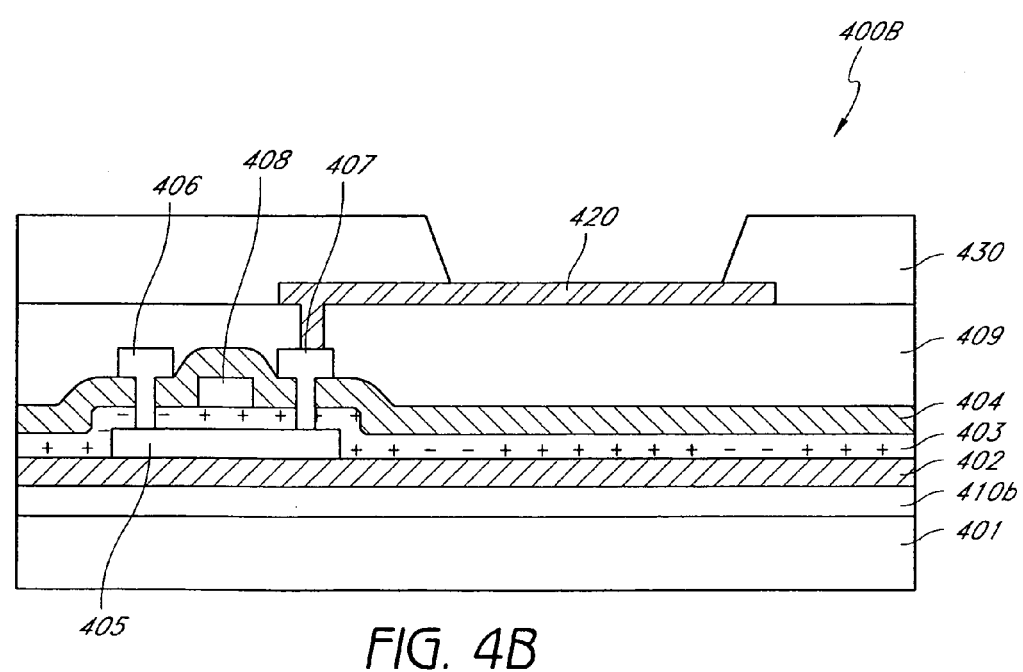

In one embodiment, the magnetic material below the transferable layer is positioned in the intermediate device 250. FIGS. 4A and 4B illustrate cross-sectional views of embodiments of the intermediate devices 400A and 400B. The illustrated intermediate devices 400A and 400B are partially fabricated organic light emitting devices (OLEDs). Each of the intermediate devices 400A and 400B includes a substrate 401, a buffer layer 402, a thin film transistor 440, a passivation layer 409, an electrode 420 and a pixel partitioning walls 430.

The thin film transistor 440 includes insulating layers 403, 404, a semiconductor layer 405, a source electrode 406, a drain electrode 407 and a gate electrode 408. The pixel partitioning walls 430 are formed over the passivation layer 409 and portions of the electrode 420, exposing a substantial portion of a top surface of the electrode 420. The electrode 420 will serve as a cathode or anode of an organic light emitting diode. The transferable layer will be formed over the exposed top surface of the electrode 420.

In FIG. 4A, a magnetic layer 410a is attached to the bottom surface of the substrate 401. In another embodiment shown in FIG. 4B, a magnetic layer 410b is positioned between the substrate 401 and the buffer layer 402. The magnetic layers 410a, 410b include a magnetic material which will be described below in detail. In one embodiment, the magnetic layer 410a or 410b has a thickness between about 5,000 Å and about 10,000 Å.

In certain embodiments, the intermediate device may include magnetic materials embedded in any components under the electrode 420, for example, the substrate 401, the buffer layer 402, the insulating layers 403, 404, and/or the passivation layer 409, depending on the design of the device. In any case, the intermediate device includes the magnetic material in an amount sufficient to make a close contact between the film donor device layer and the intermediate device.

Figure 4C:
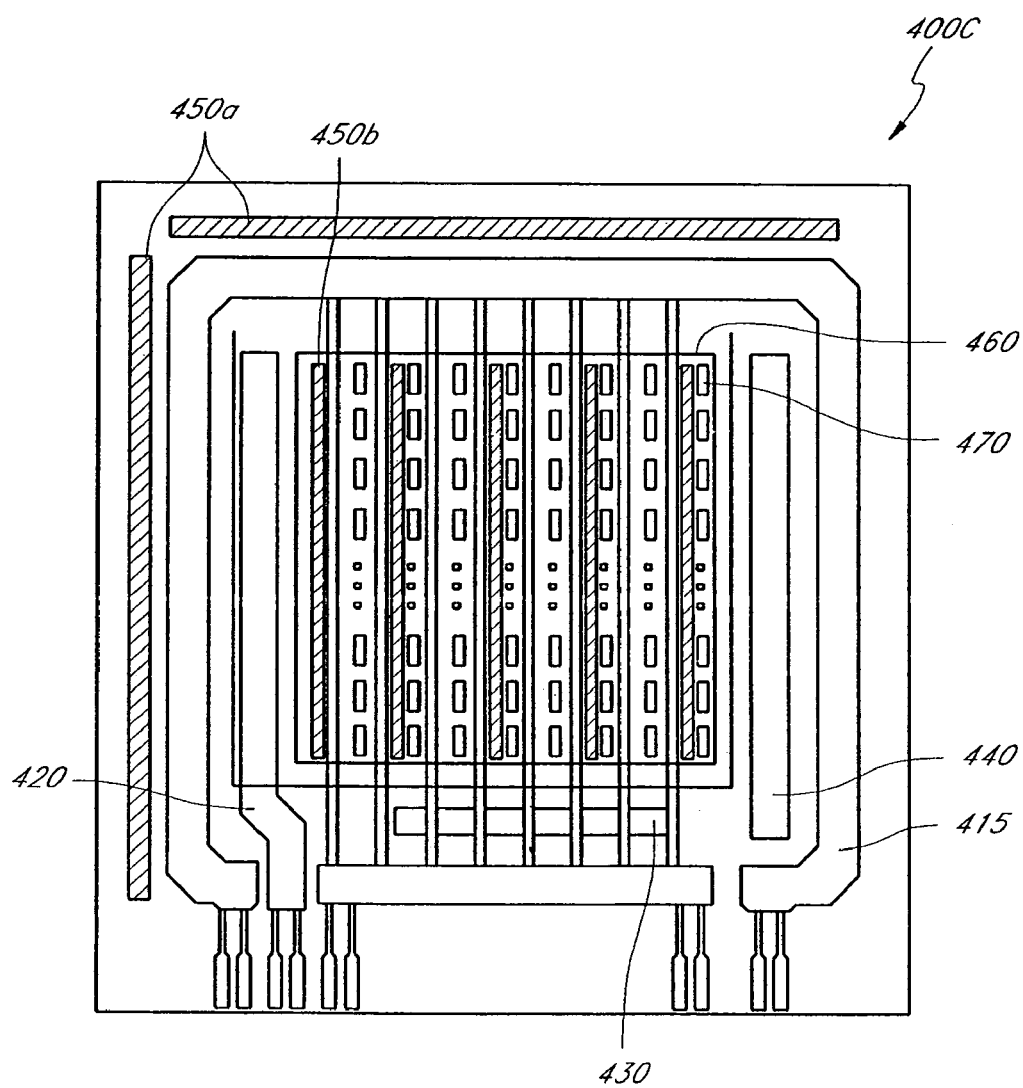
FIG. 4C illustrates a schematic top plan view of a partially fabricated electronic device according to one embodiment of the invention.

In yet another embodiment, the intermediate device may include magnetic material strips in certain regions of the intermediate device. FIG. 4C illustrates a top plan view of one embodiment of an intermediate device 400C. The illustrated device is a partially fabricated organic light emitting device 400C. The device 400C includes a display region 460, a data driver 430, a scan driver 440, and power source connectors 415 and 420. The display region 460 includes a plurality of pixels 470 in a matrix form. The illustrated device 400C includes magnetic material strips 450a and 450b. In the illustrated embodiment, the strips 450a are positioned in peripheral regions outside the display region 460. In addition, the strips 450b are formed in the display region 460. The illustrated strips 450b are substantially in parallel to one another. In other embodiments, the strips of the magnetic materials are formed in the pixel region, but not in the peripheral regions. A skilled artisan will appreciate that various other configurations of strips can be used to provide a magnetic force.

In one embodiment, the magnetic material may be a magnet including a permanent magnet or an electromagnet. The permanent magnet may be alnico magnet, ferrite magnet, rare-earth magnet, rubber magnet or plastic magnet. The permanent magnet may take at least one form selected from plates, pieces, chips, rods and particles. In one embodiment, the permanent magnet may be nanometer scale magnetic particles, plates, pieces, chips or rods. Such nano-scale particles may be deposited on a surface of a component of the intermediate device, using spin coating, e-beam deposition, or inkjet deposition. In other embodiments, the plates, pieces, chips, rods and particles can be greater than nano-scale sizes.

The permanent magnet may be substantially uniformly distributed in the magnetic layer 410a or 410b. In another embodiment, the magnetic layer 410a or 410b may have permanent magnet portions only in regions over which the transferable layer is to be transferred. In yet another embodiment, the magnetic layer may be a single plate formed of a permanent magnet.

In another embodiment, the magnetic material may be an electromagnet. The electromagnet may have at least one form selected from a solenoid and a toroid. A solenoid refers to a coil forming a shape of a straight tube. A toroid refers to a coil forming a shape of a doughnut. Typically, a toroid is a solenoid that is bent so that the ends meet. In some embodiments, a solenoid or toroid may include a core of paramagnetic or ferromagnetic material (for example, iron) inside the coil. Because an electromagnet requires an electric current to be magnetized, the electromagnet is connected to an external power source through a conductive line. In one embodiment, a non-display region of the intermediate device may include one or more electrodes electrically connected to designated for the electromagnet. The electrode(s) is configured to receive power from an external power source. In addition, the electrode(s) is connected to the electromagnet through the conductive line(s). In embodiments, the electrode(s) may be formed on an external surface of the device or body where the electromagnet is incorporated so as to make electrical connection to the external power source. In other embodiments, the electrode(s) may protrude outside the device or body where the electromagnet is incorporated. In a finished electronic device formed from the intermediate device, the electrode(s) may be inactive and buried in a dielectric material. Similar to the permanent magnet, the electromagnet may be either substantially uniformly or non-uniformly distributed, depending on the design of the intermediate device.

In yet another embodiment, the magnetic material may be a magnetically attractable material while not being a magnet. Examples of the magnetically attractable material include, but are not limited to, Fe, Ni, Cr, $Fe_2O_3$, $Fe_3O_4$, $CoFe_2O_4$, $MnFeO_4$, their alloys, and a mixture of two or more of the foregoing materials. Other examples of the magnetically attractable material may also include plastic and ceramic magnetic materials. Similar to the permanent magnet, the magnetically attractable material may be in at least one form selected from plates, pieces, chips, rods, and particles. These may be nanometer-sized particles or greater. The magnetically attractable material may be uniformly distributed in the magnetic layer 410. In another embodiment, the magnetic layer 410 may have magnetically attractable material portions only in regions over which the transferable layer is to be transferred. In yet another embodiment, the magnetic layer may be a single plate formed of the magnetically attractable material.

Figure 5A:
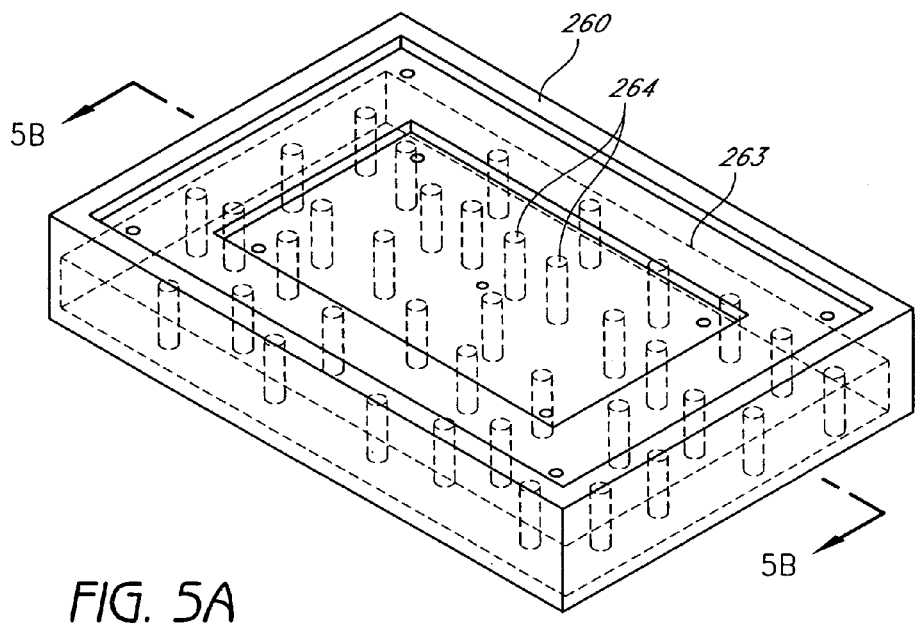
FIG. 5A illustrates a schematic perspective view of a substrate support according to one embodiment of the invention.
Figure 5B:
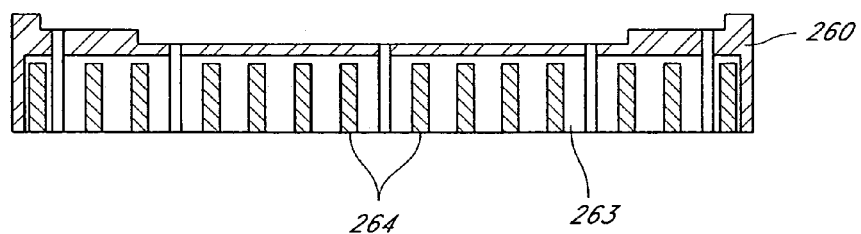
FIG. 5B illustrates a schematic cross-sectional view of the substrate support of FIG. 5A, taken along the line I-I.'

In another embodiment, the magnetic material below the transferable layer may be positioned in the substrate support. FIGS. 5A and 5B illustrate one embodiment of the substrate support 260 including the magnetic material. The illustrated substrate support 260 includes electromagnets 264 in a region 263 (denoted in dotted lines) under a recess to accommodate the intermediate device. The illustrated electromagnets 264 are aligned in a vertical direction. The electromagnets, however, may be arranged in various other configurations, depending on the design of the substrate support. The electromagnets may also have various shapes and configurations as described above with respect to the intermediate device. In certain embodiments, the magnetic material may be a permanent magnet or magnetically attractable material as described above with respect to the intermediate device.

Figure 6A:
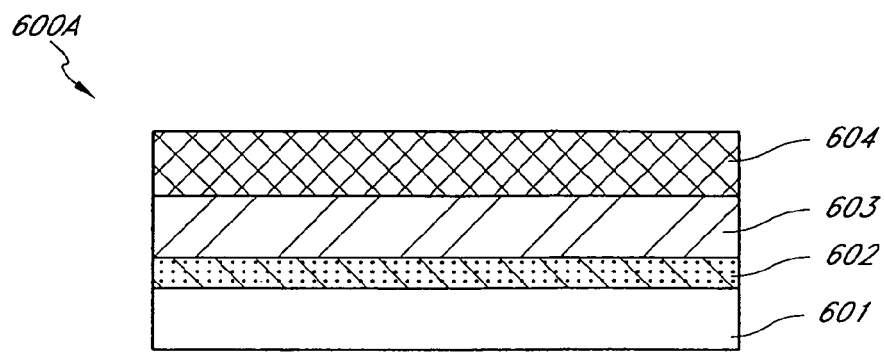
FIGS. 6A-6C illustrate schematic partial cross-sectional views of donor devices according to embodiments of the invention.
Figure 6B:
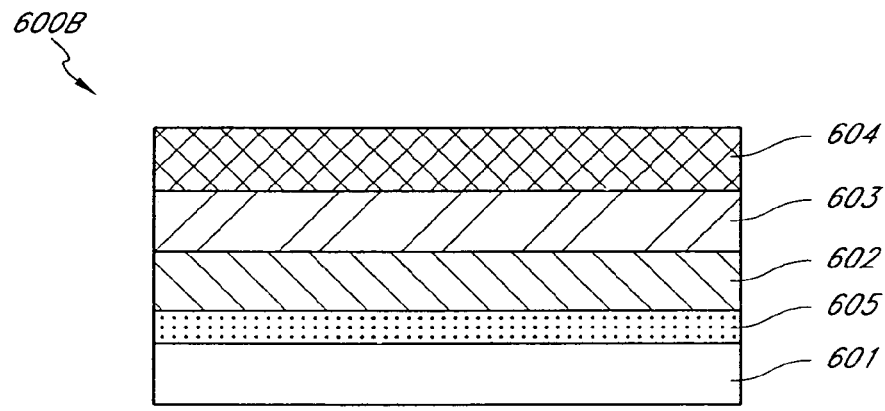
Figure 6C:
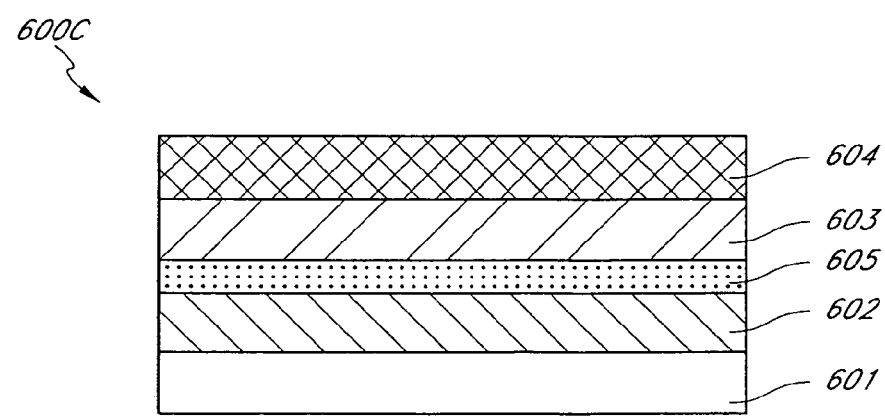

In one embodiment, the magnetic material over the transferable layer may be positioned in the film donor device. FIGS. 6A-6C are partial cross-sectional views of film donor devices 600A-600C in accordance with embodiments. Each of the film donor devices 600A-600C includes a base substrate 601, a light-to-heat conversion layer 602 overlying the base substrate 601, an inter layer 603 overlying the light-to-heat conversion layer 602, and a transferable layer 604 overlying the inter layer 603. Optionally, the film donor devices may include a buffer layer (not shown) between inter layer 603 and the transferable layer 604.

The base substrate 601 serves to provide the film donor device with a film structure. The base substrate 601 may be made of a transparent polymer. Examples of the transparent polymer include, but are not limited to, polyethylene, polyester, teleptalrate, polyacryl, polyepoxy, polyethylene, and polystyrene. The base substrate 601 has a thickness between about 10 µm and about 500 µm, optionally about 100 µm and about 400 µm.

The light-to-heat conversion layer 602 is configured to absorb laser and convert it to heat. The conversion layer 602 includes a light-absorbing material. The light-absorbing material may have an optical density of about 0.1 to about 0.4. The light-absorbing material may include a metal, a metal oxide, and/or an organic material. Examples of the metal/metal oxide include, but are not limited to, aluminum, silver, chromium, tungsten, tin, nickel, titanium, cobalt, zinc, gold, copper, tungsten, molybdenum, lead and oxides of the foregoing. The organic material may include a photosynthetic material. Examples of the organic material include polymers made from a (meth)acrylate monomer or oligomer, such as an acryl (metha)acrylate oligomer, an ester (metha)acrylate oligomer, an epoxy (metha)acrylate oligomer, an urethane (metha)acrylate oligomer, etc., or mixtures of two or more of the foregoing. In addition, the conversion layer 602 may also include other additives such as carbon black, graphite or infrared dye.

The thickness of the light-heat converting layer 602 may vary, depending on the light-absorbing materials and the fabrication methods. For example, the conversion layer may have a thickness of about 100 to about 5000 Å when using a vacuum deposition method, a laser beam deposition method, or sputtering. In another embodiment, the conversion layer may have a thickness of about 0.1 to about 2 µm when using an extrusion coating method, a gravure coating method, a spin coating method and a knife coating method.

The inter layer 603 functions to protect the light-to-heat conversion layer 603. In one embodiment, the inter layer 603 has a high heat resistance. The inter layer 603 may be made of organic or inorganic materials such as polyimide polymers. The inter layer 603 has a thickness between about 1 µm and about 1.5 µm. In certain embodiments, the intermediate device may be omitted.

The transferable layer 604 is a layer which will be transferred onto the intermediate device. The transferable layer 604 may be formed of an organic material. In one embodiment where the electronic device is an organic light emitting device, the material can be an organic light emitting material. However, the material can also be other organic materials used for forming other organic elements of the organic light emitting device. Such other elements include, but are not limited to, a hole injection layer (HIL), a hole transport layer (HTL), an electron injection layer (EIL), and an electron transport layer (ETL). In other electronic devices, any material suitable for forming a target component may be used as the material for the transferable layer. The transferable layer 604 has a thickness between about 200 Å and about 1,000 Å. The transferable layer 604 may be formed, using any suitable method, for example, extrusion coating, gravure coating, spin coating, knife coating, vacuum deposition, or chemical vapor deposition (CVD).

The buffer layer (not shown) serves to improve transfer properties of the transferable layer 604. The buffer layer may include one or more of metal oxides, metal sulfides, non-metal inorganic compounds, and organic materials. Examples of the inorganic compounds include Al and Au. Examples of the organic materials include polyimide polymers.

Referring to FIG. 6A, the light-to-heat conversion layer 602 includes a magnetic material. For example, the light-to-heat conversion layer 602 may include a permanent magnet and/or electromagnet. In other embodiments, the conversion layer 602 may include a magnetically attractive material. The magnetic material may have various configurations as described above with respect to the intermediate device. In other embodiments, the magnetic material may be embedded in the base substrate 601 or the inter layer 603. In certain embodiments, the magnetic material may be embedded in at least two of the base substrate 601, the light-to-heat conversion layer 602, and the inter layer 603. In other embodiments, the magnetic material may be embedded only in certain portions of one or more of the layers 601-603, not throughout the entire layers. For example, one or more of the layers 601-603 may include the magnetic materials only under portions of the transferable layer which will be transferred to the intermediate device.

Referring to FIGS. 6B and 6C, the film donor devices 600B and 600C include a magnetic layer 605. The magnetic layer 605 includes a magnetic material such as a permanent magnet, electromagnet, and/or magnetically attractable material. The magnetic material may have various configurations as described above with respect to the intermediate device.

In FIG. 6B, the film donor device 600B includes the magnetic layer 605 between the base substrate 601 and the light-to-heat conversion layer 602. In FIG. 6C, the film donor device 600C includes the magnetic layer 605 between the light-to-heat conversion layer 602 and the inter layer 603. In another embodiment, the film donor device may include the magnetic layer interposed between the inter layer 603 and the transferable layer 604. In yet another embodiment, the film donor device may include the magnetic layer on a bottom surface of the base substrate 601, which faces away from the light-to-heat conversion layer 602. In certain embodiments, the film donor device may have two or more magnetic layers interposed between two consecutive ones of the layers 601-604. In such embodiments, a magnetic material may further be embedded in at least one of the base substrate 601, the light-to-heat conversion layer 602 and the inter layer 603. A skilled artisan will appreciate that the configuration and combination of the magnetic layers can be varied depending on the design of the film donor device.

Figure 7:
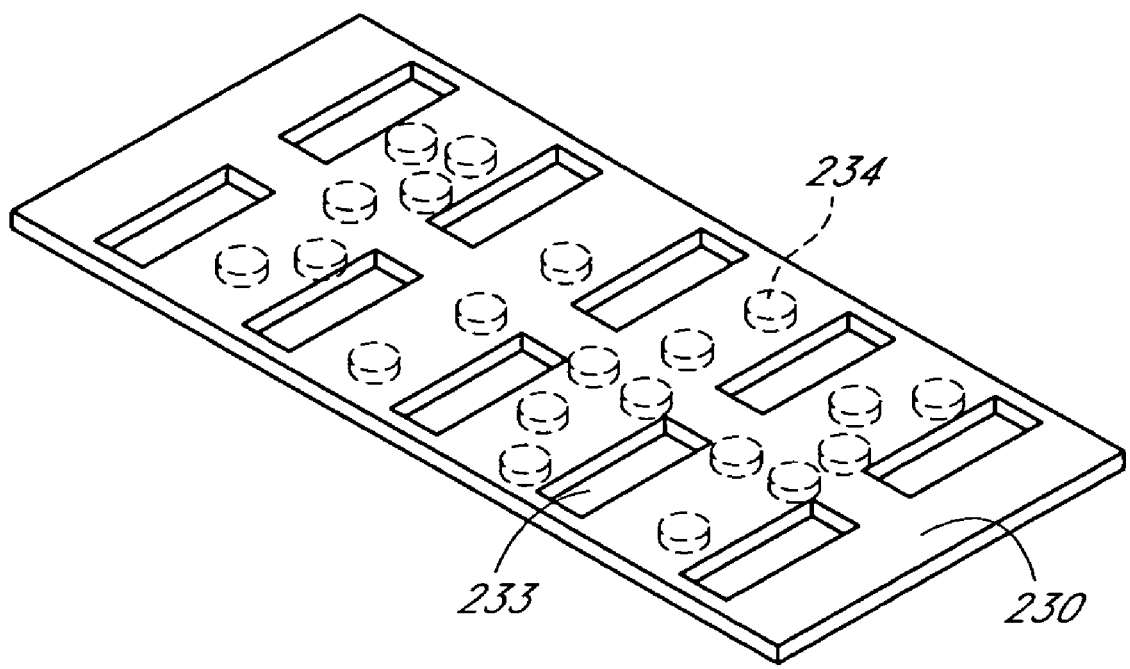
FIG. 7 illustrates a schematic perspective view of a contact frame according to one embodiment of the invention.

In another embodiment, the magnetic material over the transferable layer may be positioned in the contact frame. FIG. 7 illustrates one embodiment of the contact frame 230. The illustrated contact frame 230 includes a magnetic material embedded in the frame. The magnetic material may be a permanent magnet or electromagnet, as described above with respect to the intermediate device. In another embodiment, the magnetic material may be a magnetically attractable material, as described above.

In certain embodiments, the contact frame 230 may include a separate magnetic layer. The magnetic layer includes a magnetic material as described above with respect to the intermediate device. The magnetic layer can be attached on at least one of top and bottom surfaces of the contact frame 230. In another embodiment, the magnetic layer may be embedded in the contact frame 230. In such embodiments, the layer is patterned to have openings corresponding to the openings of the contact frame. The openings of the contact frame and the layer allow the laser beam to be directed onto portions of the film donor device 241. This configuration allows selective transfer of the transferable film onto the intermediate device 250. In another embodiment, the contact frame itself may be formed of the magnetic material. In all of the foregoing embodiments, the contact frame includes the magnetic material in an amount sufficient to provide a magnetic force to press the film donor device against the intermediate device.

Laser-Induced Thermal Imaging Process

Figure 8:
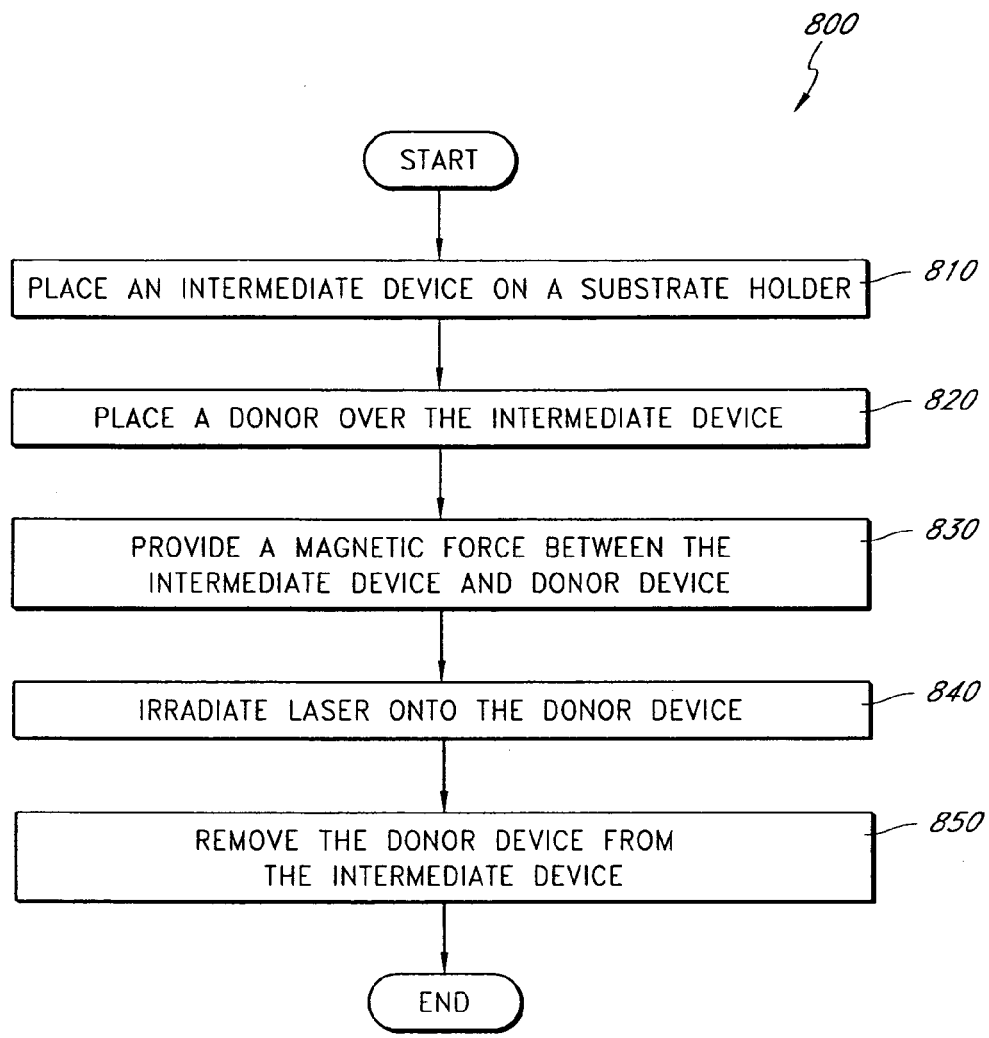
FIG. 8 is a flowchart of a laser-induced thermal imaging method according to one embodiment of the invention.

The laser-induced thermal imaging (LITI) process according to embodiments employs a magnetic force to provide a close contact between a film donor device and an intermediate device. FIG. 8 is a flowchart illustrating one embodiment of the LITI process.

First, in step 810, an intermediate device 250 is placed on a substrate support 260. During this step, the intermediate device 250 is moved by any suitable moving mechanism, for example, a robotic mechanism. Next, in step 820, a film donor device 241 is placed over the intermediate device 250. First, the film donor device 241 is vertically aligned with the intermediate device 250 with its transferable layer facing down. Then, the film donor device 241 is moved downward onto the intermediate device 250. At least a portion of the transferable layer is contacted with the intermediate device 250. Similar to the step 810, the film donor device 241 may be moved by the moving mechanism.

In step 830, a magnetic force is provided to pressure the film donor device 241 against the intermediate device 250. The magnetic force may be generated by magnetic materials positioned in two of the LITI components as described above: one over the transferable layer and the other under the surface on which the layer is to be transferred. In some embodiments, one of the two LITI components may include a magnet whereas the other may include a magnetically attractable material that is not a magnet. In other embodiments, both of the two LTIT components may include magnets. The magnet may include a permanent magnet and/or electromagnet. In one embodiment where the magnet includes an electromagnet, the magnetic force may be time-selectively produced depending on the needs of the LITI process. In certain embodiments, components including a magnet may also contain a magnetically attractable material.

At this step, the magnetic force makes the film donor device 241 pushed against the intermediate device 250, which makes the transferable layer to more closely contact the surface on which the layer is to be transferred. In this process, all or at least some of air gaps or bubbles from between the film donor device 241 and the intermediate device 250 may be removed. This step facilitates a transfer of the transferable layer onto the intermediate device 250.

In step 840, a laser is irradiated onto the film donor device 241. The laser provides thermal, energy required to transfer the transferable layer onto the intermediate device 250. In this step, a laser oscillator 220 is activated to irradiate a laser onto a top surface of the film donor device 241. In one embodiment employing a contact frame 230 with openings, the laser passes through the openings, and reaches the top surface of the film donor device 241. During this process, the laser is directed to selected areas of the film donor device 241. The laser reaches the light-to-heat conversion layer of the film donor device 241 through the base substrate. The light-to-heat conversion layer converts the light energy into thermal energy, generating heat. The heat is transferred to selected portions of the transferable layer. With this process, the portions of the transferable layer are released from the film donor device 241 and transferred to the intermediate device 250. In another embodiment where no contact frame is used, laser is selectively irradiated onto certain portions of the top surface of the film donor device 241.

Subsequently, in step 850, the film donor device 241 is removed from over the intermediate device 250, leaving portions of the transferable layer on the top surface of the intermediate device 250. The film donor device 241 may be removed using the same moving mechanism as that used in the step 820.

Figure 9A:
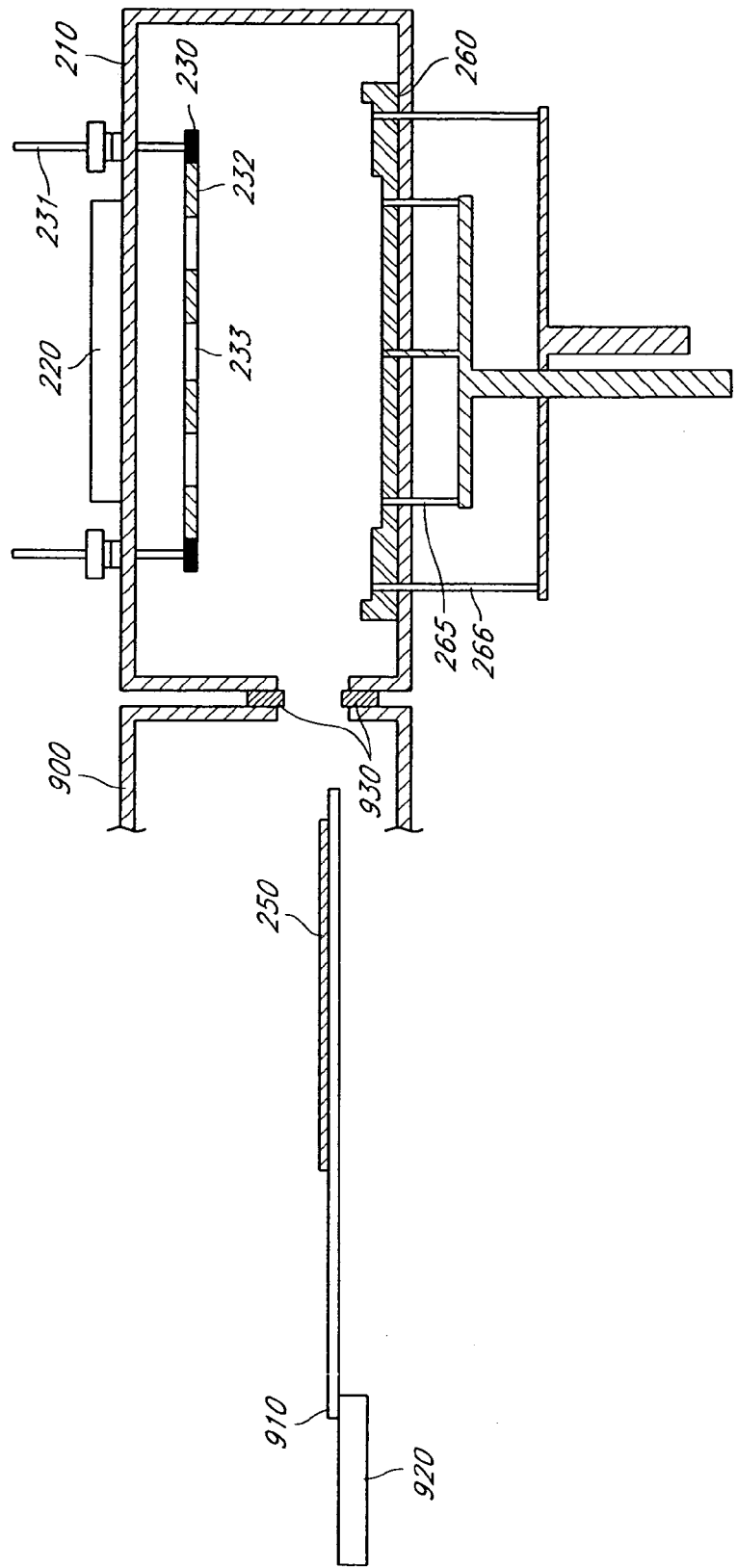
FIGS. 9A-9F illustrate a laser-induced thermal imaging method according to one embodiment of the invention.
Figure 9B:
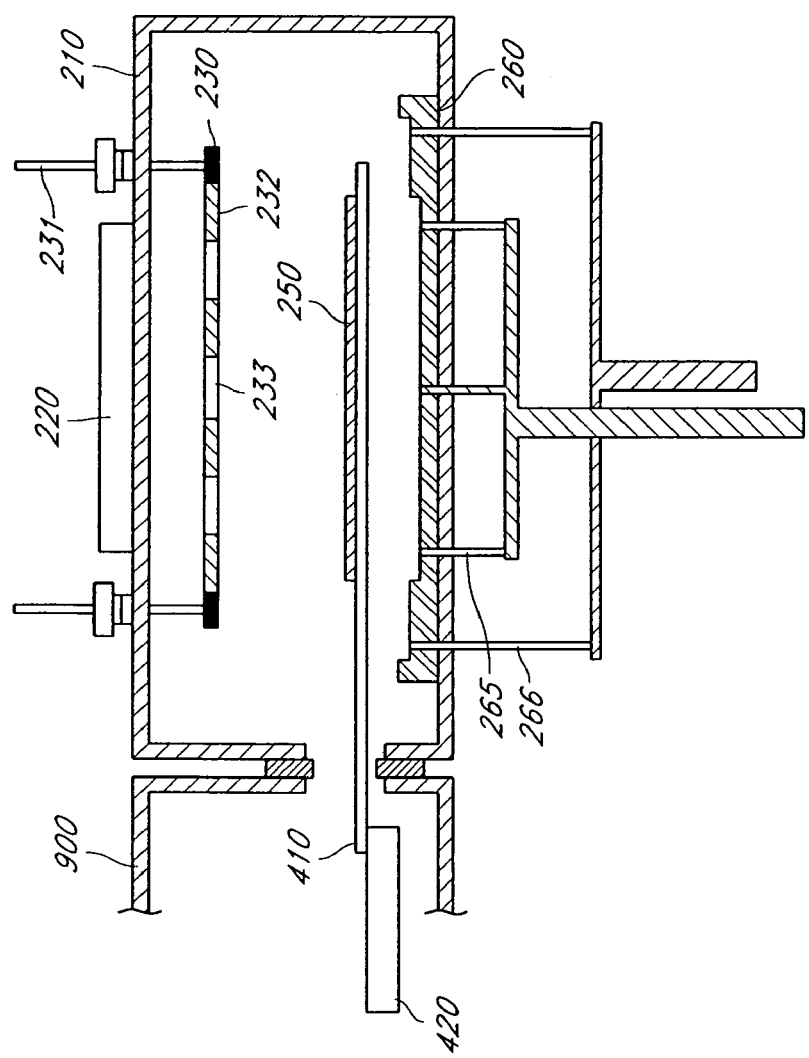
Figure 9C:
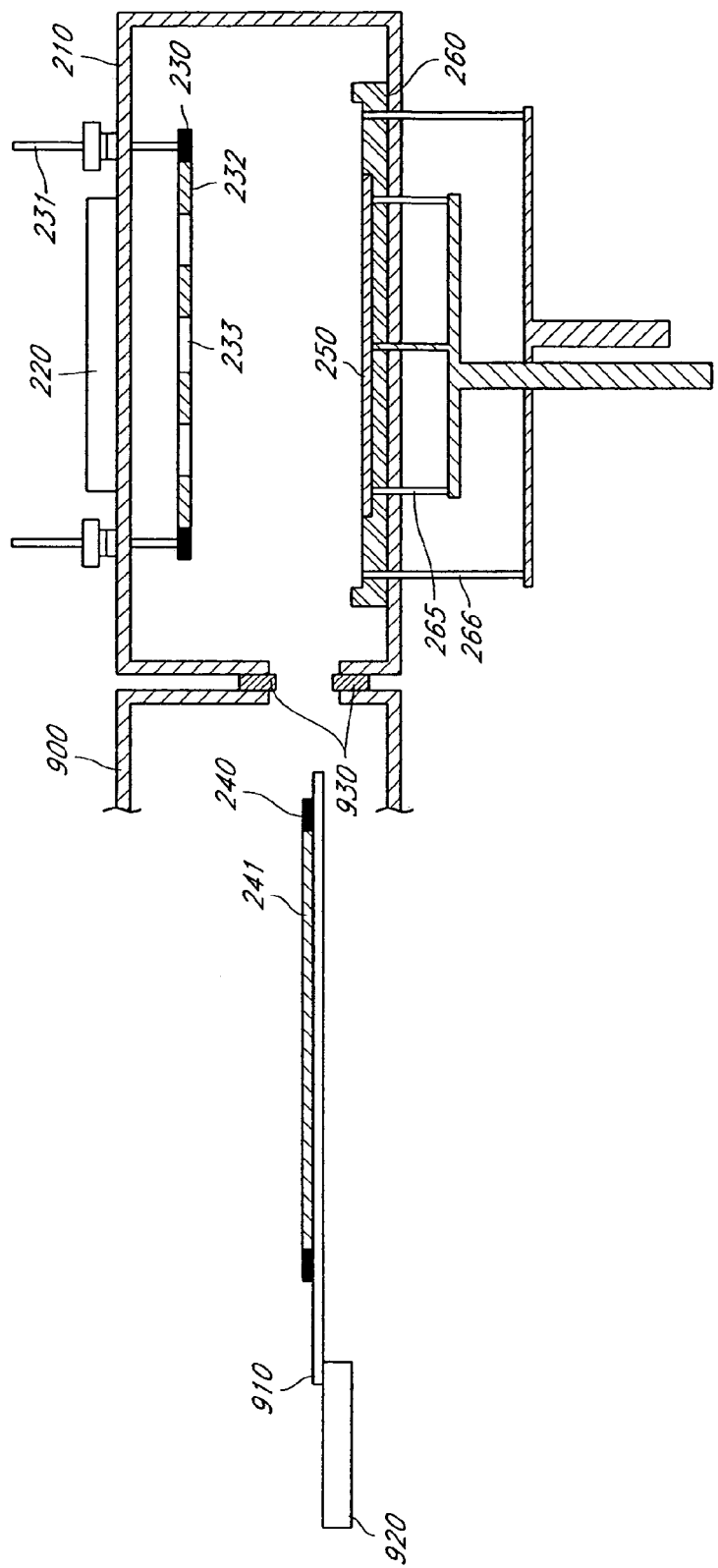

Referring to FIGS. 9A-9F, an intermediate device 250 is introduced into a transfer chamber 900. The intermediate device 250 is placed on an end-effector 910 of an robot arm 920 in the transfer chamber 900. Subsequently, the intermediate device 250 is transported into a LITI chamber 210, as shown in FIG. 9B. Then, the intermediate device 250 is placed on a substrate support 260, as shown in FIG. 9C.

Figure 9D:
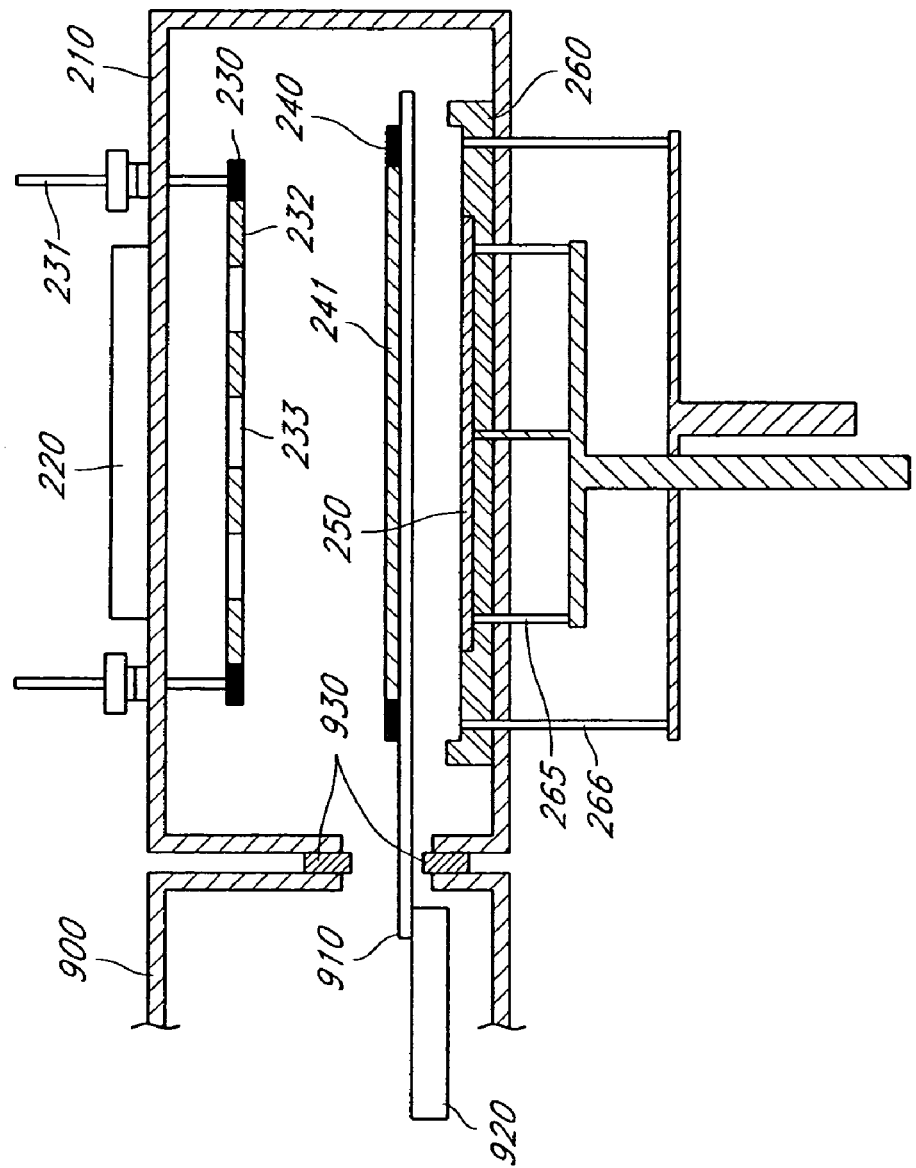
Figure 9E:
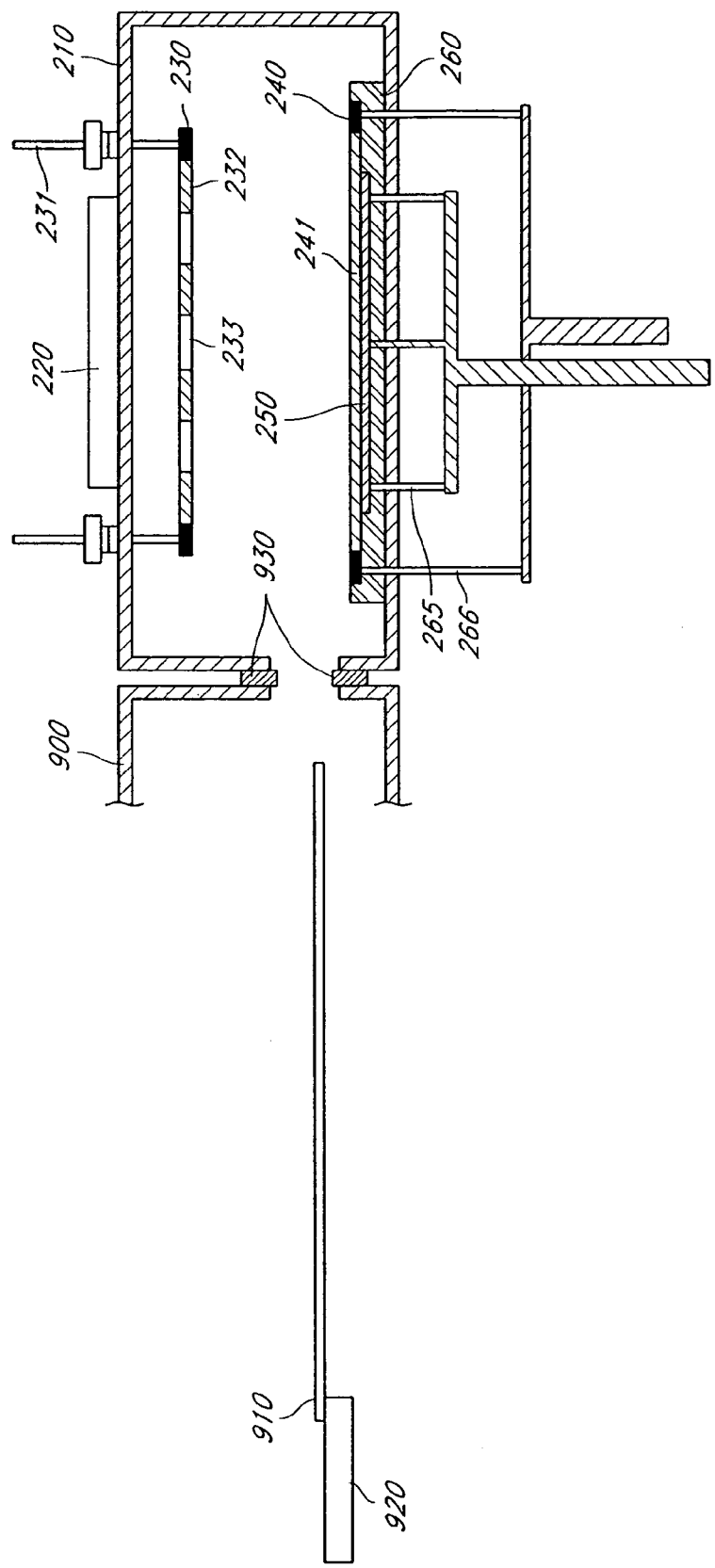

Next, a film donor device 241 is placed on the end effector 910, as shown in FIG. 9C. Subsequently, the film donor device 241 is introduced into the LITI chamber 210, as shown in FIG. 9D. The film donor device 241 is vertically aligned with the intermediate device 250. Then, the film donor device 241 is moved down onto the intermediate device 250, as shown in FIG. 9E. The end-effector 910 is then retrieved from the LITI chamber 210. Subsequently, a gate valve 930 is shut to provide a closed reaction chamber. In one embodiment, a vacuum atmosphere may be maintained throughout the transfer chamber and the LITI chamber during these steps.

Figure 9F:
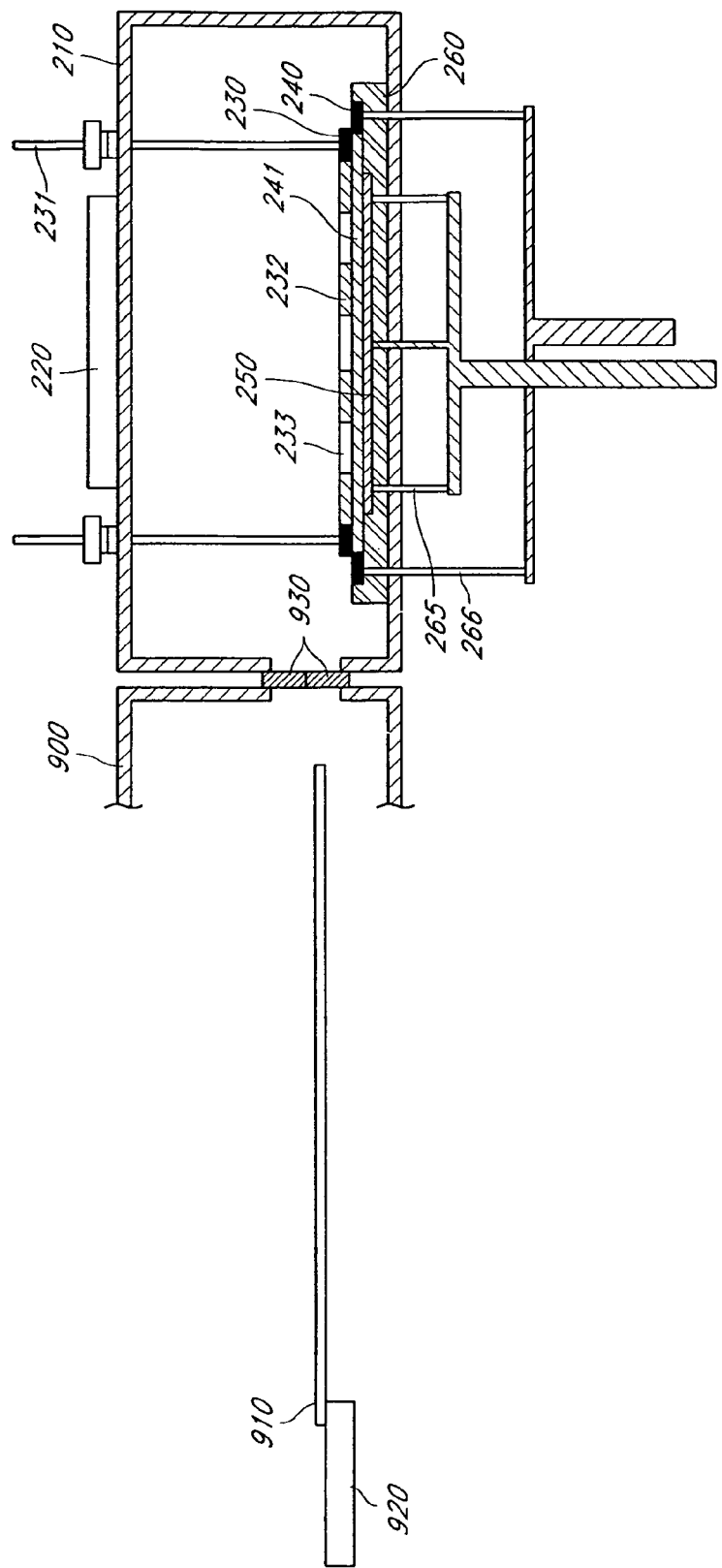

Optionally, a contact frame may be provided over the film donor device. In FIG. 9F, the contact frame 230 is moved down over the film donor device 241. The contact frame 230 provides a weight over the film donor device 241. The contact frame 230 may facilitate making a close contact between the film donor device 241 and the intermediate device 250. In other embodiments, the contact frame may be omitted.

Next, a magnetic force is provided to make a close contact between the intermediate device and the film donor device. The magnetic force may be generated by magnetic materials positioned in two of the LITI apparatus components: one below the transferable layer and the other over the transferable layer as described above. A skilled artisan will appreciate that the magnetic material may be provided in certain other components, depending on the design of a LITI apparatus. In all of the foregoing embodiments, the magnetic force is exerted between the intermediate device and the film donor device in a sufficient strength to make a contact without air gaps or bubbles therebetween. Details of the magnetic material positions and configurations are as described above with respect to the LITI apparatus.

FIGS. 10A-10D are cross-sectional views illustrating how a transferable layer is transferred onto an intermediate device. The illustrated intermediate device is a partially fabricated organic light emitting device 400. In the illustrated embodiment, magnetic materials are positioned in the intermediate device and the film donor device. In other embodiments, the magnetic materials may be provided in other components of the LITI apparatus as described above.

Referring to 10A, an intermediate device 400 includes a thin film transistor (TFT) structure 411, a magnetic layer 410, an electrode 420, and a pixel partitioning layer 430. A portion 412 of the electrode 420 is exposed through the pixel partitioning layer 430. An organic layer will be formed on the exposed portion 412 as will be better understood from later descriptions.

Figure 10A:
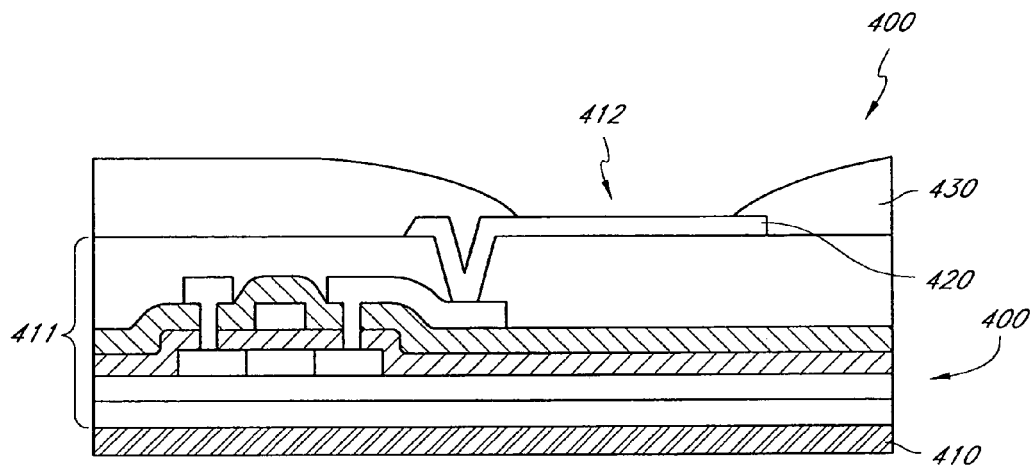
FIGS. 10A-10D illustrate a laser-induced thermal imaging method according to one embodiment of the invention.
Figure 10B:
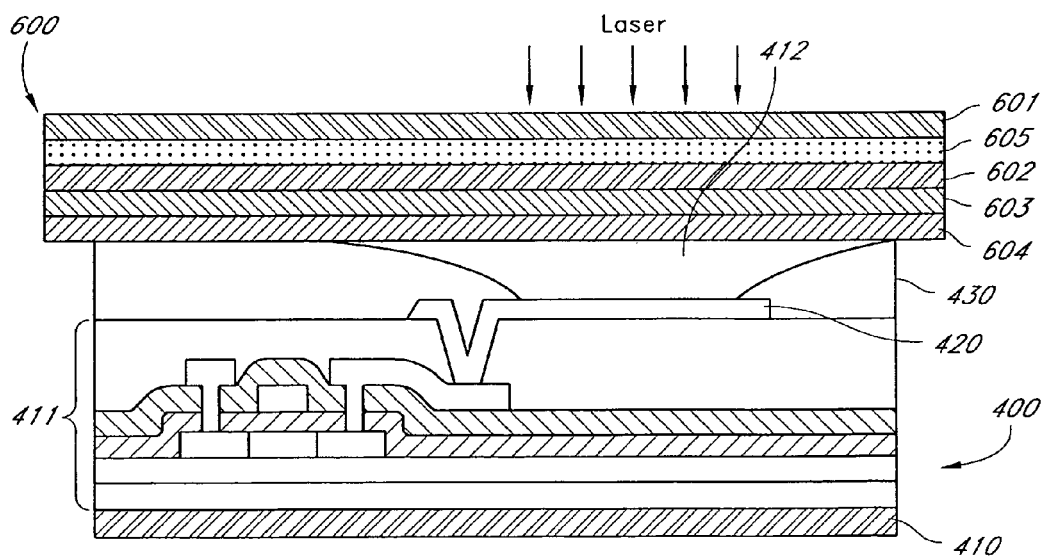

Next, as shown in FIG. 10B, a film donor device 600 is placed over the intermediate device 400. The film donor device 600 includes a base substrate 601, a magnetic layer 605, a light-to-heat conversion layer 602, an inter layer 603, and a transferable layer 604 as described above with respect to FIG. 6B. The transferable layer 604 is at least partially in contact with a top surface of the pixel partitioning layer 430, as shown in FIG. 10B. During this step, a magnetic force is exerted between the film donor device 600 and the intermediate device 400.

Then, laser is irradiated onto a selected portion of the film donor device 600. The selected portion is positioned over the exposed portion 412 of the electrode 420. The laser passes through the base substrate and the magnetic layer 605, and reaches the light-to-heat conversion layer 602. The light-to-heat conversion layer 602 converts the light energy into thermal energy, generating heat. The heat is transferred to the transferable layer 604 via the inter layer 603.

Figure 10C:
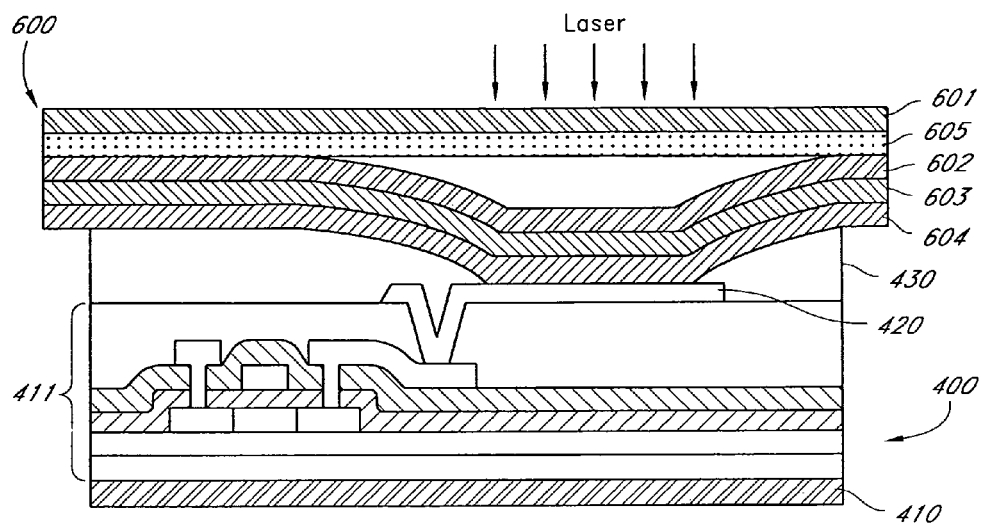

Then, upon receiving the heat, a portion of the transferable layer 604 is delaminated from the film donor device 600 and comes in contact with the exposed portion 412 of the electrode 420, as shown in FIG. 10C. In the illustrated embodiment, portions of the conversion layer 602, the inter layer 603 and the transferable layer 604 are separated from the magnetic layer 605. In other embodiments, only the transferable layer 604 may be separated from the film donor device 600.

Figure 10D:
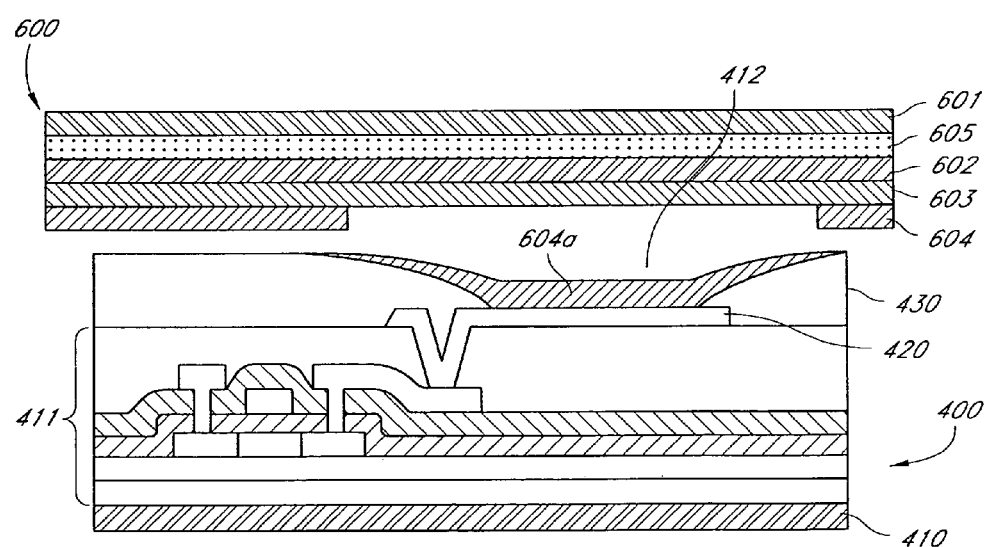

Subsequently, as shown in FIG. 10D, the film donor device 600 is removed from over the intermediate device 400. After this step, only a portion 604a of the transferable layer remains on the intermediate device 400.

In the embodiments described above, a magnetic force is used to provide a close contact between the film donor device and the intermediate device. This configuration, unlike suctioning, does not need air pressure in the LITI chamber. Therefore, the LITI process can be performed in a vacuum atmosphere. Since processes performed prior to or subsequent to the LITI process are typically also carried out in a vacuum atmosphere, the LITI process can be performed without breaking vacuum throughout the processes. The vacuum atmosphere may be maintained from the process of depositing the hole injection layer (HIL) to the process of depositing the second electrode layer. (cathode layer) In addition, the LITI process reduces occurrence of impurities or gaps between the donor film and the intermediate device. This improves a lifetime, yield, and reliability of the resulting electronic device.

Although various embodiments of the present invention have been shown and described, it will be appreciated by those technologists in the art that changes might be made in these embodiments without departing from the principles and spirit of the invention, the scope of which is defined in the claims and their equivalents.

What is claimed is:

1. A method of making an electronic device using laser-induced thermal imaging, the method comprising:
   providing a receiving apparatus comprising an intermediate product and a supporting device, the intermediate product comprising a receiving surface, the supporting device being configured to support the intermediate product, the receiving apparatus comprising a first magnetic layer;
   providing a film donor apparatus comprising a second magnetic layer and a transferable film layer, wherein each of the first and second magnetic layers comprises a magnet or a magnetically attractable material such that a magnetically induced attractive force is created between the first and second magnetic layers when arranged closely;
   arranging the receiving apparatus and the film donor apparatus such that the transferable film layer faces the receiving surface and that the transferable film layer and the receiving surface are interposed between the first and second magnetic layers; and
   approaching the film donor apparatus toward the receiving apparatus so as to create an attractive force between the first and second magnetic layers sufficient to make the transferable film layer contacts the receiving surface.

2. The method of claim 1, further comprising transferring at least part of the transferable film layer onto the receiving surface by laser-induced thermal imaging.

3. The method of claim 2, further comprising separating the film donor apparatus from the receiving apparatus, and wherein the at least part of the transferable film layer transferred onto the receiving surface remains on the receiving surface.

4. The method of claim 1, wherein the film donor apparatus further comprises a substrate and a light-to-heat conversation layer interposed between the transferable film layer and the substrate, and wherein the method further comprises applying light to the light-to-heat conversion layer so as to generate heat therein and transfer the heat to the transferable film layer.

5. The method of claim 4, wherein the attractive force maintains the transferable film layer to contact the receiving surface substantially free of bubbles therebetween during applying light to the light-to-heat conversion layer.

6. The method of claim 4, wherein the magnet comprises an electromagnet, and wherein the method further comprises applying an electrical power to the electromagnet during applying the light.

7. The method of claim 1, wherein the electronic device comprises an organic light emitting display.

8. The method of claim 7, wherein the transferable film layer comprises an organic material to form a layer of the organic tight emitting display selected from the group consisting of a light emitting layer, a hole injection layer, a hole transportation layer, an electron injection layer and an electron transportation layer.

9. The method of claim 1, wherein the method is performed in a substantially vacuum atmosphere without breaking the substantially vacuum atmosphere during the steps of arranging and approaching.

10. The method of claim 1 wherein the magnet comprises at least one selected from the group consisting of a permanent magnet and an electromagnet.

11. The method of claim 1, wherein the magnet or magnetically attractable material comprises one or more forms selected from the group consisting of plates, chips, rods, and particles.

12. The device of claim 1, wherein the magnetically attractable material comprises one or more materials selected from the group consisting of Fe, Ni, Cr, $Fe_2O_3$, $Fe_3O_4$, $CoFe_2O_4$, and alloys of two or more of the foregoing.

13. The method of claim 1, wherein the first and second magnetic layers comprise the magnet or the magnetically attractable material in an amount sufficient to generate a magnetic field from about 5 mG (gauss) to about 50 mG (gauss).

14. The method of claim 1, wherein the intermediate product comprises the first magnetic layer.

15. The method of claim 1, wherein the supporting device comprises the first magnetic layer.

16. The method of claim 1, wherein the film donor apparatus comprises a single integrated device comprising the transferable film layer and the second magnetic layer.

17. The method of claim 1, wherein the film donor apparatus comprises a single integrated film donor device comprising a substrate and the transferable film layer, and wherein the film donor apparatus further comprises a contact frame configured to provide a weight onto the film donor device such that the film donor device is pressed against the receiving surface of the intermediate product.

18. The method of claim 17, wherein the contact frame comprises the second magnetic layer.

19. The method of claim 1, wherein one of the first and second magnetic layers comprises the magnet, and wherein the other of the first and second magnetic layers comprises the magnetically attractable material.

20. The method of claim 1, wherein the magnet or the magnetically attractable material is distributed substantially throughout the first and second magnetic layers.

* * * * *